United States Patent [19]

Kurosawa et al.

[11] Patent Number: 4,505,025

[45] Date of Patent: Mar. 19, 1985

[54] METHOD FOR MANUFACTURING A SEMICONDUCTOR DEVICE

[75] Inventors: Kei Kurosawa; Fumio Horiguchi, both of Tokyo, Japan

[73] Assignee: Tokyo Shibaura Denki Kabushiki Kaisha, Kawasaki, Japan

[21] Appl. No.: 497,407

[22] Filed: May 23, 1983

[30] Foreign Application Priority Data

May 31, 1982 [JP] Japan ................... 57-92917

[51] Int. Cl.³ .................. H01L 21/95; H01L 21/76
[52] U.S. Cl. ................... 29/576 W; 29/571; 29/578; 148/1.5; 357/49; 357/55
[58] Field of Search .............. 29/571, 576 W, 576 B, 29/580, 578; 148/1.5, 187, 174, 175; 156/643, 345; 204/192 E, 192 EC; 357/60, 55, 49

[56] References Cited

U.S. PATENT DOCUMENTS

| | | | |
|---|---|---|---|
| 4,333,227 | 6/1982 | Horng et al. | 29/576 W X |
| 4,338,138 | 7/1982 | Cavaliere et al. | 29/576 W X |
| 4,378,630 | 4/1983 | Horng et al. | 29/576 W X |
| 4,393,573 | 7/1983 | Kato et al. | 29/571 |
| 4,394,237 | 7/1983 | Donnelly et al. | 156/643 X |
| 4,404,735 | 9/1983 | Sakurai | 29/580 X |
| 4,419,813 | 12/1983 | Iwai | 148/187 X |

OTHER PUBLICATIONS

J. Electrochem. Soc. 128, 423 (1981), A. C. Adams and C. D. Capio, Feb. 1981.

29th Lecture Meeting by Applied Physics Institute, Lecture No. 2p-S-6, by Ogawa et al., Mar. 1982.

*Primary Examiner*—Brian E. Hearn
*Assistant Examiner*—David A. Hey
*Attorney, Agent, or Firm*—Oblon, Fisher, Spivak, McClelland & Maier

[57] ABSTRACT

A method for manufacturing a semiconductor device is disclosed which comprises the step of forming one or more first grooves by selectively etching a field region of a semiconductor substrate, the step of forming, on the entire surface of the substrate including the first groove, a first insulating film having a thickness substantially equal to or greater than the depth of the first groove, this first insulating film having on its upper surface one or more second grooves corresponding to the first groove, at least one of the second grooves having a width greater than its depth, the step of selectively forming, in at least one of the second grooves having a width greater than its depth, a second insulating film having a thickness substantially equal to the depth of the second groove, the step of forming a third insulating film having a flat surface on its whole surface, the step of applying an anisotropic dry etching technique to the resultant structure to expose the surface of the substrate, thereby obtaining a substrate which has a flat surface and having the first insulating material buried in the field region, and the step of forming a semiconductor element in the surface region of the substrate isolated by the first insulating material buried in the field region of the substrate.

21 Claims, 12 Drawing Figures

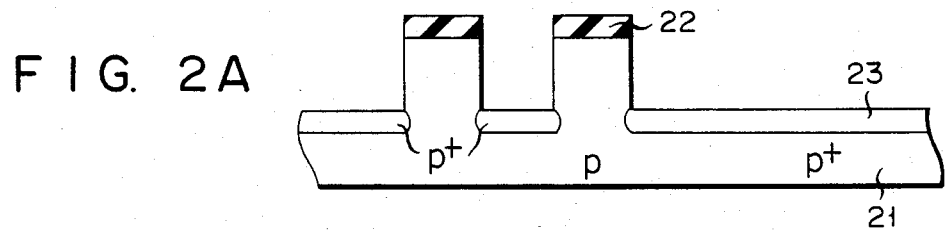
F I G. 2A
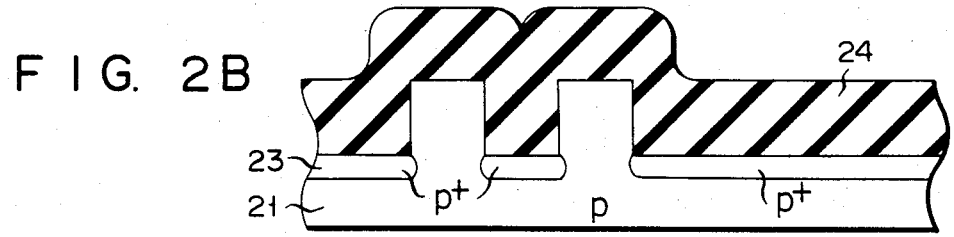
F I G. 2B

METHOD FOR MANUFACTURING A SEMICONDUCTOR DEVICE

BACKGROUND OF THE INVENTION

The present invention relates to a method for manufacturing a semiconductor device. More particularly, the present invention relates to a method for manufacturing a semiconductor device which comprises the step of burying a relatively thick insulating film in the field region so as to make its upper surface substantially flush with the upper surface of a semiconductor substrate.

In a semiconductor device, particularly an MOS type semiconductor device, which uses a silicon substrate, forming a thick oxide film in the region between elements, what is called a "field region", is generally carried out in order to eliminate the deterioration of insulation due to the production of a parasitic channel and at the same time, to reduce the parasitic capacity.

In the prior art, a selective oxidation method is well known as such thick oxide film-forming method. This method involves oxidizing at high temperature a wafer prepared by coating an element formation region with an oxidation-resistive mask, typically with a silicon nitride film, thereby selectively forming a thick oxide film in the field region. According to this selective oxidation method, however, during the oxidation the field oxide film eats into the element formation region from an end portion of the silicon nitride film in the form of a bird's beak. As a consequence, one substantial element dimension is decreased, which impairs the high integration of an integrated circuit. Further, according to the selective oxidation method, after the formation of the field oxide film, a step difference equal to approximately half the thickness of the field oxide film is produced between the field region and the element formation region. Since this step difference remains until the succeeding steps are completed, it decreases the reliability of the resultant semiconductor device by causing a decrease in the precision of a succeeding lithography, a disconnection of a metal interconnection layer in the step difference, etc.

A method for forming the field oxide film is known which is capable of removing the formation of the abovementioned bird's beak and preventing the production of the step difference between the field region and the element formation region. This method is described in, for example, Japanese Patent Application No. 56-55450. This method will be explained briefly with reference to FIGS. 1A to 1F.

First, as shown in FIG. 1A, for example, an oxide film 12 and then an aluminum mask thereon are formed on a p-type silicon substrate 11 by an ordinary photolithography technique. The reference numeral 14 denotes a resist mask used for patterning the oxide film 12 and the aluminum mask 13. Next, after removal of the resist mask 14, as shown in FIG. 1B, the silicon substrate 11 in the field region is etched, using the aluminum mask 13 as a mask, to a depth substantially equal to the thickness of a predetermined field oxide film, thereby forming grooves. Subsequently, an impurity of the same conductivity as that of the substrate 11, for example, boron, is ion-implanted in those grooves, thereby forming an ion-implanted region 15.

Thereafter, as shown in FIG. 1C, a $SiO_2$ film 16a is deposited on the whole surface of the resultant structure by, for example, a plasma CVD method. Next, when etching is carried out for about one minute using, for example, ammonium fluoride solution, since the etching rate for the edge portions of the plasma CVD $SiO_2$ film 16a is five to twenty times as high as that for the flat portions, the edge portions of the $SiO_2$ film 16a located at the step difference portions are selectively etched, with the result that the $SiO_2$ film 16a is disconnected at each portion of step difference, whereby the side face of the aluminum mask 13 is exposed. When, thereafter, the aluminum mask 13 is removed by etching, the portions of the plasma CVD $SiO_2$ film deposited on the aluminum mask 13 are lifted off together with the aluminum mask. Thus, as shown in FIG. 1D, the CVD $SiO_2$ film 16a is buried only in the field region. At this time, as shown in FIG. 1D, fine grooves are formed between the field region and the element formation region.

Next, as shown in FIG. 1E, the CVD $SiO_2$ film 16b is deposited on the entire surface of the resultant structure. Recesses corresponding to the fine grooves are formed on the surface of this CVD $SiO_2$ film 16b. Thereafter, a flowable material film 17, the etching rate for which is equal to the etching rate for the CVD $SiO_2$ film 16b, is coated on the CVD $SiO_2$ film 16b, thereby permitting said flowable material film 17 to be introduced into said recesses and bury them, thus permitting the resultant structure to have a flat surface. Thereafter, the flowable material film 17 and the CVD $SiO_2$ film 16b are etched uniformly over the entire surface of the resultant structure in the order mentioned. As shown in FIG. 1F, the surface of the silicon substrate 11 corresponding to the element formation region is thus exposed. At this time, the field region is kept buried within the $SiO_2$ film 16 on a substantially flat basis. Thereafter, predetermined elements are formed by the ordinary method, in the element formation region.

The above-mentioned prior art method, however, has the following drawbacks. In the prior art method, after etching the substrate using the aluminum mask 13, this mask must be left as a lift-off material for a succeeding lift-off step. For this reason, the surface of the etched substrate is contaminated by aluminum. Prior to forming the CVD $SiO_2$ film on the substrate, the substrate surface is conventionally treated with acid to stabilize the interfacial property. However, the above-mentioned prior art method makes it impossible to effect the acid treatment due to the existence of the aluminum mask 13. Instead, in the prior art, the substrate surface is washed by an organic solvent, which fails to sufficiently wash the substrate surface. Further, while the CVD $SiO_2$ film is usually formed on the substrate through the thermal oxide film for the purpose of stabilizing the interfacial property, the above-mentioned prior art method does not permit the formation of the thermal oxide film due to the existance of the aluminum mask 13. This makes it necessary to deposit the plasma CVD $SiO_2$ film 16a directly onto the etched silicon substrate. For the above-mentioned reasons, the prior art method results in the interfacial property of the field region becoming unstable.

Furthermore, according to the prior art method, it is impossible to obtain, with high reproducibility, the discontinuity of the CVD $SiO_2$ film 16a at the portions of step difference by selective etching. For this reason, in some cases, it is impossible to carry out the lift-off step.

The problems inherent in the prior art method, as mentioned above, have undesirable effects upon the characteristics of the element formed in a succeeding step, and thus decrease the reliability and yield of the resulting integrated circuit.

SUMMARY OF THE INVENTION

Accordingly, an object of the invention is to provide a method for manufacturing a semiconductor device which enables the stabilization of the interfacial property in the field region.

Another object of the invention is to provide a method for manufacturing a semiconductor device which enables an increase in the reliability and the yield of the elements involved.

In the method for manufacturing a semiconductor device according to the invention, first, an etching mask is formed in the element formation region of a semiconductor substrate. By using the etching mask, the field region of the substrate is selectively etched, thereby forming one or more first grooves. In the method in accordance with the invention, there is no need to use an aluminum film, as in the prior art, as the etching mask; instead, a thermal oxide film, for example, can be used. It is to be noted here that even the use of an aluminum film for the etching mask will not cause a problem since it is removed after etching is completed. Next, a first insulating material is deposited on the whole surface of the substrate including the interior of the first grooves so as to have a thickness substantially equal to or greater than the depth of the first grooves, thereby forming a first insulating film. The first insulating material is usually CVD $SiO_2$. As a result, on the surface of this first insulating film, there is produced a second groove or grooves as a reflection of the first groove or grooves. In the present invention, it is necessary that at least one of the second groove or grooves should have a width greater than its depth. A second insulating material is selectively coated or deposited in at least one of the second grooves having a width greater than the depth, so as to have a thickness substantially equal to the depth of the second groove, thereby forming a second insulating film. The formation of this second insulating film is possible using ordinary photolithography without using the lift-off method as in the prior art. Preferably, this second insulating film should be formed so as to prevent a gap or groove from being produced between this film and the side surface of the second groove. Some small gap or groove may be produced, but this will not cause problems. Further, it is not always necessary to form the second insulating film in the second groove which is smaller in width than in depth. The second insulating material includes organic resist material, CVD $SiO_2$, $Si_3N_4$, etc. Thereafter, the surface of the resultant structure is flattened by forming a third insulating film over the entire surface thereof. The formation of this flattened third insulating film can be effected by coating or depositing a flowable material such as, for example, organic resist material, low melting temperature glass, etc. or by depositing a plasma $Si_3N_4$ film and thereafter etching back by a reactive ion etching technique.

The low melting temperature glass may be phosphosilicate glass, boro-phospho-silicate glass, arsenosilicate glass, etc. These glasses can be made into a flat film by heating after they have been deposited. Thereafter, the surface of the resultant structure is subjected to anisotropic dry etching, thereby causing the surface of the substrate to be exposed. Thus, it is possible to obtain a structure wherein the first insulating material is buried in the field region. The anisotropic dry etching in this case is carried out under the condition in which the etching rates for the first, second and third insulating materials are substantially equal to each other or under the condition in which the etching rate for the first insulating material is higher than the etching rates for the second and third insulating materials. These etching conditions can be easily determined by suitably selecting the type of etching gas, pressure and power in accordance with the type of the first, second and third insulating materials.

According to the invention, since the lift-off method of the prior art is not used, it is not necessary to use an aluminum mask in the etching step for forming the first grooves. Further, even when the aluminum mask is used, it is possible to eliminate this aluminum mask after completion of the etching step. According to the invention, therefore, the inner face of the first groove cannot be contaminated by aluminum. Further, even if such a contamination were to occur, it is possible to clean the resultant structure by acid treatment before the first insulating film is formed. Further, it is also possible to form a thermal oxide film on the surface of the semiconductor substrate prior to forming the first insulating film. According to the present invention, therefore, it is possible to stabilize the interfacial property of the field region of the semiconductor substrate.

Further, according to the present invention, neither the selective etching with respect to the step difference portion of the CVD $SiO_2$ film nor the lift-off processing with respect to the CVD $SiO_2$ film on the aluminum mask is carried out. Thus, the invention is easily reproducible, and it simplifies the process steps involved. All of these merits make it possible to increase the reliability as well as the yield of the elements formed.

BRIEF DESCRIPTION OF THE DRAWINGS

FIGS. 2A to 2E are sectional views showing the process of forming the field insulating film in accordance with an embodiment of the present invention.

DETAILED DESCRIPTION OF THE PREFERRED EMBODIMENT

Figure 1A:
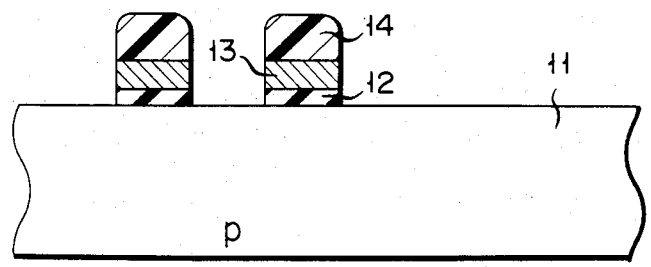
FIGS. 1A to 1F are sectional views showing the process of forming a field insulating film in accordance with a prior art method.
Figure 1B:
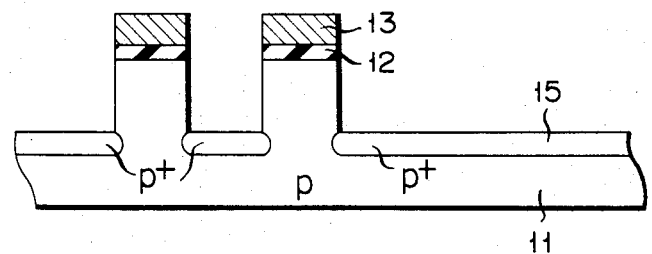
Figure 1C:
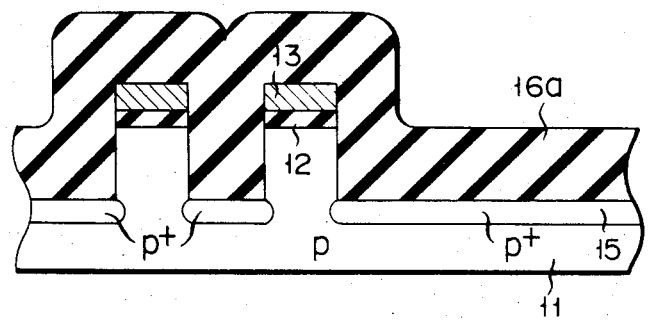
Figure 1D:
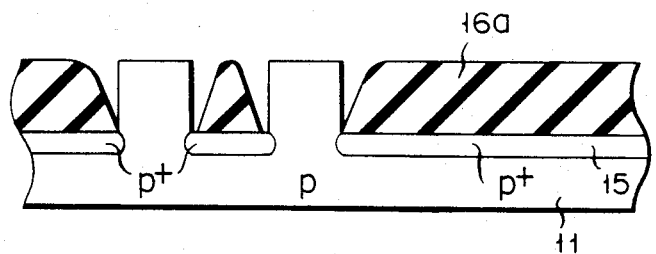
Figure 1E:
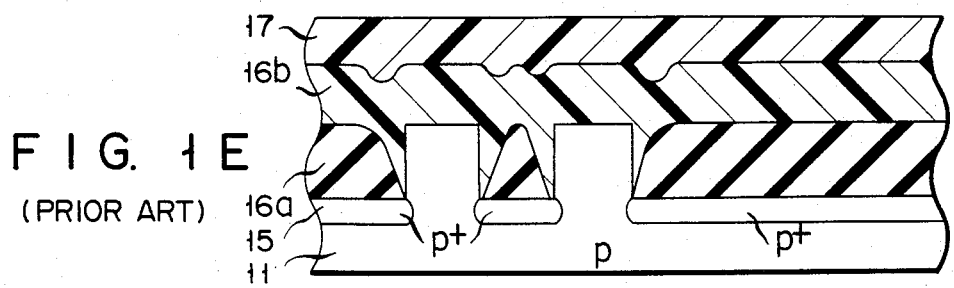
Figure 1F:
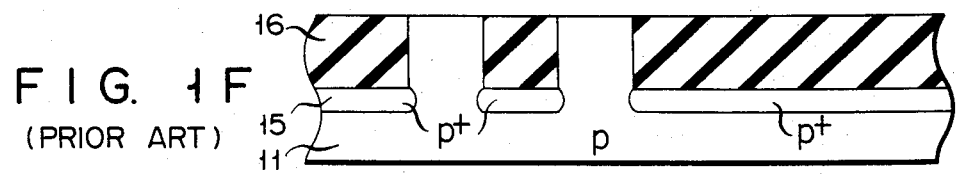
Figure 2C:
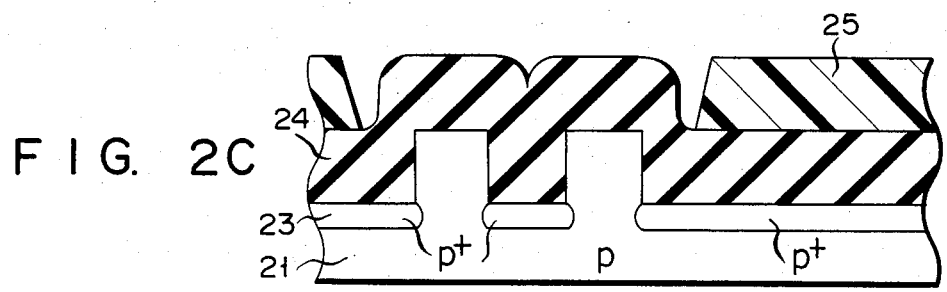

FIGS. 2A to 2E show the steps of manufacturing a semiconductor device in accordance with an embodiment of the present invention. First, on the surface of a p-type silicon substrate 21 having a face orientation (100) and a specific resistance of 5 to 50 $\Omega$cm, there is formed a mask pattern such as a thermal oxide film 22 for etching the substrate and for permitting the substrate to undergo an ion implantation. By using this thermal oxide film 22 as a mask, the surface of the substrate 21 is selectively etched, thereby forming a plurality of first grooves in the field region. Further, by using the same thermal oxide film 22 as a mask, an impurity having the same conductivity type as that of the substrate 21 is ion implanted in the field region or the bottom of the first grooves, thereby forming a $p^+$-layer 23 (FIG. 2A). This $p^+$-layer 23 serves as what is called a "channel stopper", acting to prevent a channel from being formed in the field region. Next, after removing the thermal oxide film 22 by an etching technique, a thin thermal oxide film is formed, if necessary, on the entire surface of the substrate 21. Thereafter, as shown in FIG. 2B, a CVD $SiO_2$ film 24 is deposited, as a first insulating film 24, on the whole surface of the substrate 21 so as to have a thickness greater than the depth of the first grooves. At this time, second grooves are formed in the surface of the CVD $SiO_2$ film 24 at the positions corresponding to those of the first grooves previously formed in the surface of the substrate.

Figure 2D:
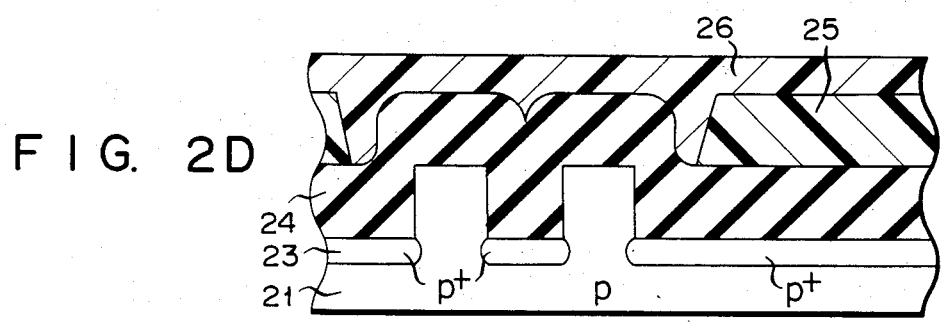

Thereafter, as shown in FIG. 2C, by using ordinary photolithography, a resist film 25 consisting of, for example, polymethacrylic anhydride (PMAH), is formed as a second insulating film, to a thickness substantially the same as the depth of the second grooves. Thereafter, as shown in FIG. 2D, a resist film 26 consisting of the same material as the resist film 25 is coated as a third insulating film on the entire surface of the resultant structure. At this time, the small depressions in the surface of the CVD $SiO_2$ film 24 and between the CVD $SiO_2$ film 24 and the resist film 25 are buried by the resist film 26. At the same time, since the resist film 26 consists of flowable material, the surface of the resist film 26 is made flat.

Figure 2E:
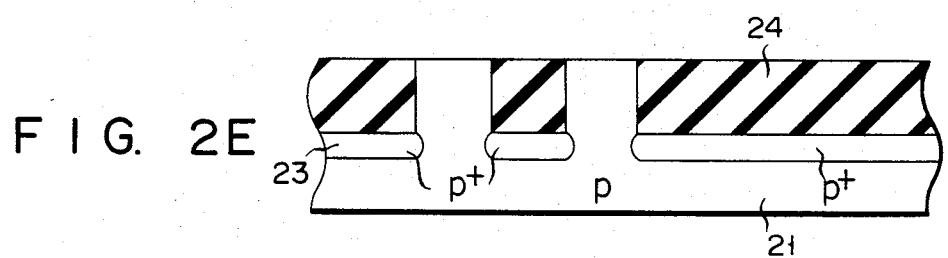
Figure 3:
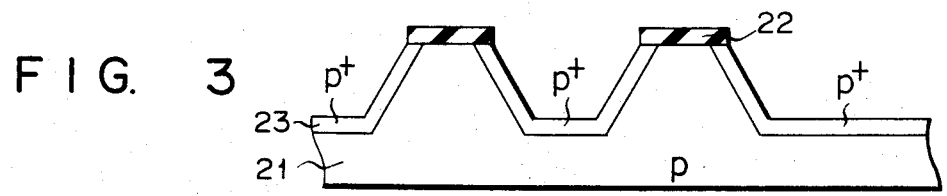
FIG. 3 is a sectional view showing the formation of grooves having sloped side surfaces.

Subsequently, the whole surface of the resultant structure is etched by the use of a reactive ion etching technique based on the use of a fluorocarbon gas such as Freon as an etchant, thereby removing all of the resist films 26 and 25 and part of the CVD $SiO_2$ film 24. The etching condition at this time is so determined that the etching rate for the resist films 26 and 25 may be equal to that for the CVD $SiO_2$ film 24. At this etching step, the pressure is 30 mTorr, the power is 0.22 w/cm$^2$, and the etching gas is $CF_4$. As a result, as shown in FIG. 2E, a flat semiconductor structure in which the CVD $SiO_2$ film 24 is buried selectively in the field region is obtained. Thereafter, a predetermined semiconductor element is formed in the element formation region by an ordinary element forming method, thereby obtaining a semiconductor device.

While in the foregoing embodiment, the etching rates for the first, second and third insulating films is equalized, it is possible to use etching conditions which permit the etching rate for the first insulating film to become higher than those for the second and third insulating films. In this case, from the time of performing the etching until the substrate is exposed, part of the second and third insulating films remains, but such residual insulating film can be easily removed by subsequent etching, thus obtaining a semiconductor structure whose upper surface is flat.

Further, in the above-mentioned embodiment, as shown in FIG. 2A, the p$^+$-layer 23 is formed only at the bottom portions of the grooves, but, for the purpose of preventing the formation of a parasitic channel it is desirable to form the p$^+$-layer not only at the bottom portions but also at the side surface of the grooves. Such formation of the p$^+$-layer at the side surfaces of the grooves can be performed by the ion implantation of the p-type impurity into the field region before the etching of this field region. However, such a formation can be more easily carried out by first forming the grooves having inclined side surfaces and then ionimplanting a p-type impurity into those grooves. The grooves having the sloped side surfaces can be formed by performing the wet etching technique using a mixture of, for example, KOH and isopropyl alcohol as an etchant, or by performing the plasma etching technique using a chlorine-based gas. Where the silicon substrate having the face orientation (100) is subjected to etching by the use of said wet etching technique, it is possible to obtain an inclined side surface of face orientation (111) having an inclination of 54.6°.

As mentioned above, according to the embodiments of the invention, the level of the field region in which the insulating material is buried can be made flush with the level of the element formation region. Therefore, it is possible to increase the precision of the lithography in manufacturing an LSI. At the same time, the method of the invention is highly convenient for a three-dimensional integration of elements. Further, according to the embodiments of the invention, the interfacial property of the field region becomes stable, and so the steps for manufacturing a semiconductor device are simplified and can be practiced with high controllability, thereby enabling an enhancement in the reliability of the resultant device as well as an increase in the manufacturing yield.

What we claim is:

1. A method for manufacturing a semiconductor device comprising the following steps:
    A. forming at least one first groove by selectively etching a field region of a substrate; then
    B. forming on the entire surface of said substrate, including said first groove, a first insulating film having a thickness substantially equal to or greater than the depth of said first groove; wherein said insulating film is formed on said substrate with at least one second groove corresponding to said first groove and wherein at least one of said second grooves has a width greater than the depth of said second groove; followed by
    C. selectively forming in at least one of said second grooves a second insulating film having a thickness substantially equal to the depth of said second groove; and then
    D. forming a third insulating film having a flat surface over the entire surface of the resulting structure; followed by
    E. anisotropically dry etching the resulting structure to expose the surface of said substrate such that said first insulating material is buried in said field region; wherein the etching rate for said first, second and third insulating materials are substantially equal to each other or the etching rate for said first insulating material is higher than those for said second and third insulating materials; and then
    F. forming semiconductor elements in the surface region of said substrate which are isolated from said first insulating material.

2. A method for manufacturing a semiconductor device according to claim 1, in which said first insulating film consists of CVD $SiO_2$; said second insulating film consists of one compound selected from the group consisting of organic resist material, CVD $SiO_2$, and $Si_3N_4$; and said third insulating film consists of one compound selected from the group consisting of organic resist material, low melting temperature glass and $Si_3N_4$.

3. A method for manufacturing a semiconductor device according to claim 2, in which said third insulating film consists of the low melting temperature glass and is formed by depositing said glass and then heating and melting the same.

4. A method for manufacturing a semiconductor device according to claim 2, in which said third insulating film consists of $Si_3N_4$ and is formed by depositing $Si_3N_4$ and thereafter applying a reactive ion etching technique to the resultant structure.

5. A method for manufacturing a semiconductor device according to claim 1, which further comprises the step of, after forming said first groove, ion-implanting an impurity of the same conductivity type as that of said substrate into a bottom portion of said first groove.

6. A method for manufacturing a semiconductor device according to claim 5, which further comprises the step of, prior to forming said first groove, ionimplanting an impurity of the same conductivity type as that of said substrate into said field region.

7. A method for manufacturing a semiconductor device according to claim 1, which further comprises forming said first groove to have sloped side surfaces, ion-implanting an impurity of the same conductivity as that of said substrate into the bottom portron and said sloped side surface of said first groove.

8. A method for manufacturing a semiconductor device according to claim 7, in which said semiconductor substrate has a face orientation (100) and said first groove is formed by selectively etching the field region of said substrate by the use of a mixture of KOH and isopropyl alcohol.

9. A method for manufacturing a semiconductor device according to claim 7, in which said first groove is formed by selectively etching the field region of said substrate by a plasma etching technique using a chlorine-based gas.

10. A method for manufacturing a semiconductor device according to claim 1, in which said anisotropic dry etching is a reactive ion etching technique.

11. A method of manufacturing a semiconductor device according to claim 1, wherein said first groove includes two grooves differing from each other in width, said second groove is formed is said first insulating ilm corresponding to said first wider groove, a small depression is formed in said first insulating film corresponding to said first narrower groove, and said second insulating film is formed in said first wider groove to form another small depression between the first insulating film and the second insulating film.

12. A method for manufacturing a semiconductor device comprising the following steps:
   A. forming a mask pattern film onto the surface of a P-type silicon substrate; then
   B. forming at least one first groove in the field region of said substrate by an etching technique; and then
   C. forming a channel stopper in the form of a p±layer in either said field region on the bottom of said first groove by ion implanting an impurity having the same conductivity type as that of said substrate; and then
   D. removing said mask pattern film by an etching technique; followed by
   E. depositing a first insulating film having a thickness greater than the depth of said first groove entirely on said substrate, thereby forming at least one second groove corresponding to said first groove in said first insulating film; and then
   F. forming a second insulating film by photolithography in at least one of said second grooves wherein said second insulating film has a thickness substantially the same as the depth of said second groove; and then
   G. coating a third insulating film on the entire surface of the resulting structure; and then
   H. anisotropically etching the resulting structure to expose the surface of said substrate such that said first insulating material is buried in said field region; wherein the etching rate for said first, second and third insulating materials are substantially equal to each other or the etching rate for said first insulating material is higher than those for said second and third insulating material; and then
   I. forming semiconductor elements in the surface region of said substrate which are isolated from said first insulating material.

13. A method for manufacturing a semiconductor device according to claim 12, wherein said first groove includes two grooves differing form each other in width, said second groove is formed in said first insulating film corresponding to said first wider groove, a small depression is formed in said first insulating film corresponding to said first narrower groove, and said second insulating film is formed in said first wider groove to form another small depression between the first insulating film and the second insulating film.

14. A mthod for manufacturing a semiconductor device according to claim 12, in which said first insulating film consists of CVD $SiO_2$; said second insulating film consists of one compound selected from the group consisiting of organic resist material, CVD $SiO_2$, and $Si_3N_4$; and said third insulating film consisits of one compound selected from the group consisting of organic resist material, low melting temperature glass and $Si_3N_4$.

15. Amethod for manufacturing a semiconductor device according to claim 14, in which said third insulating film consists of the low melting temperature glass and is formed by depositing said glass and then heating and melting the same.

16. A method for manufacturing a semiconductor device according to claim 14, in which said third insulating film consists of $Si_3N_4$ and is formed by depositing $Si_3N_4$ and thereafter applying a reactive ion etching technique to the resultant structure.

17. A method for manufacturing a semiconductor device according to claim 12, which further comprises the step of, prior to forming said first groove, ion-implanting an impurity of the same conductivity type as that of said substrate into said field region.

18. A method for manufacturing a semiconductor device according to claim 12, which further comprises forming said first groove to have sloped side surfaces, ion-implanting an impurity of the same conductivity as that of said substrate into the bottom portion and said sloped side surface of said first groove.

19. A method for manufacturing a semiconductor device according to claim 18, in which said semiconductor substrate has a face orientation (100) and said first groove is formed by selectively etching the field region of said substrate by the use of a mixture of KOH and isopropyl alcohol.

20. A method for manufacturing a semiconductor device according to claim 18, in which said first groove is formed by selectively etching the field region of said substrate by a plasma etching technique using a chlorine-based gas.

21. A method for manufacturing a semiconductor device according to claim 12, in which said anisotropic dry etching is a reative ion etching technique.

* * * * *